(12) United States Patent
Nagata et al.

(10) Patent No.: US 11,426,976 B2
(45) Date of Patent: Aug. 30, 2022

(54) COPPER-CLAD LAMINATE

(71) Applicant: SUMITOMO METAL MINING CO., LTD., Tokyo (JP)

(72) Inventors: Junichi Nagata, Niihama (JP); Hironori Tanba, Niihama (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

(21) Appl. No.: 15/930,899

(22) Filed: May 13, 2020

(65) Prior Publication Data
US 2021/0101366 A1 Apr. 8, 2021

(30) Foreign Application Priority Data

Oct. 2, 2019 (JP) .............................. JP2019-182353

(51) Int. Cl.
*B32B 15/04* (2006.01)
*B32B 15/08* (2006.01)
(Continued)

(52) U.S. Cl.
CPC ............ *B32B 15/043* (2013.01); *B32B 15/08* (2013.01); *B32B 15/20* (2013.01); *C23C 14/025* (2013.01);
(Continued)

(58) Field of Classification Search
CPC ............ B32B 2379/08; B32B 2371/00; B32B 2367/00; B32B 2311/12; B32B 2311/18; B32B 2311/22; B32B 15/043; B32B 15/08; B32B 15/20; H05K 1/0393; H05K 1/036; H05K 3/388; H05K 3/022; H05K 2201/0129; H05K 3/38; C23C 14/20; C23C 14/025; C23C 14/205; C23C 28/021; C23C 28/023; C23C 28/321; C23C 28/322;
(Continued)

(56) References Cited

U.S. PATENT DOCUMENTS

| | | |
|---|---|---|
| 2002/0177000 A1 | 11/2002 | Katsuki |
| 2008/0090095 A1 | 4/2008 | Nagata |
| 2013/0240257 A1* | 9/2013 | Tanaka ................... C23C 26/00 174/257 |

FOREIGN PATENT DOCUMENTS

| | | |
|---|---|---|
| CN | 101040571 A | 9/2007 |
| JP | 2007-301781 A | 11/2007 |

(Continued)

*Primary Examiner* — Michael E. La Villa
(74) *Attorney, Agent, or Firm* — Kratz, Quintos & Hanson, LLP

(57) ABSTRACT

To provide a copper-clad laminate which maintains adhesion between a resin film and a conductor layer and which suppresses the occurrence of wrinkles. A copper-clad laminate has a base film containing a thermoplastic resin, an underlying metal layer film-formed on a surface of the base film by a dry plating method, and a copper layer film-formed on a surface of the underlying metal layer. The underlying metal layer has a mean thickness of 0.3 to 1.9 nm. Since the underlying metal layer has a mean thickness of 0.3 nm or more, it is possible to maintain adhesion between the base film and a conductor layer. Since the underlying metal layer has a mean thickness of 1.9 nm or less, it is possible to suppress an increase in the temperature of a film during film-forming of the underlying metal layer, and it is possible to suppress the occurrence of wrinkles.

6 Claims, 1 Drawing Sheet

(51) Int. Cl.
  *B32B 15/20*  (2006.01)
  *H05K 3/38*  (2006.01)
  *C23C 14/20*  (2006.01)
  *C23C 14/02*  (2006.01)
  *C23C 28/00*  (2006.01)
  *C23C 30/00*  (2006.01)
  *C23C 28/02*  (2006.01)
  *H05K 1/03*  (2006.01)
  *H05K 3/02*  (2006.01)

(52) U.S. Cl.
  CPC ............ *C23C 14/20* (2013.01); *C23C 28/021* (2013.01); *C23C 28/023* (2013.01); *C23C 28/321* (2013.01); *C23C 28/322* (2013.01); *C23C 30/00* (2013.01); *H05K 3/38* (2013.01); *H05K 3/388* (2013.01); *B32B 2311/12* (2013.01); *B32B 2311/18* (2013.01); *B32B 2311/22* (2013.01); *B32B 2367/00* (2013.01); *B32B 2371/00* (2013.01); *B32B 2379/08* (2013.01); *C23C 14/205* (2013.01); *H05K 1/036* (2013.01); *H05K 1/0393* (2013.01); *H05K 3/022* (2013.01); *H05K 2201/0129* (2013.01); *Y10T 428/1291* (2015.01); *Y10T 428/12556* (2015.01); *Y10T 428/12569* (2015.01); *Y10T 428/12806* (2015.01); *Y10T 428/12819* (2015.01); *Y10T 428/12826* (2015.01); *Y10T 428/12847* (2015.01); *Y10T 428/12882* (2015.01); *Y10T 428/12903* (2015.01); *Y10T 428/12917* (2015.01); *Y10T 428/12924* (2015.01); *Y10T 428/12931* (2015.01); *Y10T 428/12944* (2015.01); *Y10T 428/2495* (2015.01); *Y10T 428/24959* (2015.01); *Y10T 428/24975* (2015.01); *Y10T 428/26* (2015.01); *Y10T 428/265* (2015.01)

(58) Field of Classification Search
  CPC ............ C23C 30/00; Y10T 428/12569; Y10T 428/12556; Y10T 428/12882; Y10T 428/12903; Y10T 428/1291; Y10T 428/12917; Y10T 428/12924; Y10T 428/12944; Y10T 428/12931; Y10T 428/12847; Y10T 428/12819; Y10T 428/12826; Y10T 428/12806; Y10T 428/265; Y10T 428/26; Y10T 428/2495; Y10T 428/24959; Y10T 428/24975
  See application file for complete search history.

(56) References Cited

FOREIGN PATENT DOCUMENTS

| | | |
|---|---|---|
| JP | 2014-233891 A | 12/2014 |
| TW | 537967 B | 6/2003 |

* cited by examiner

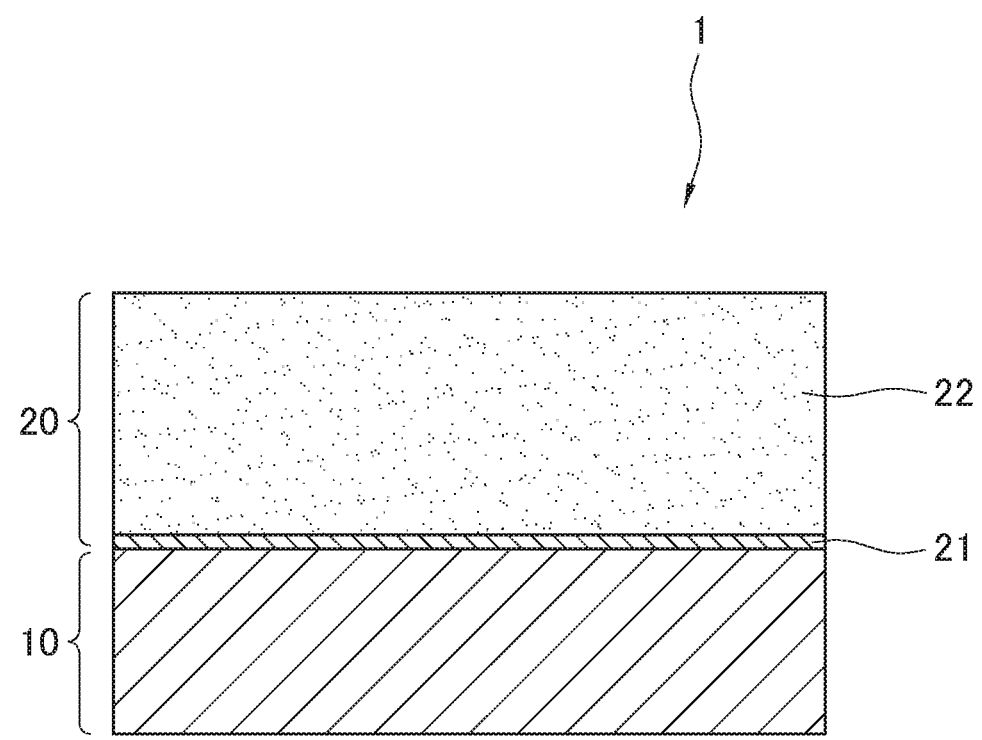

COPPER-CLAD LAMINATE

TECHNICAL FIELD

The present invention relates to a copper-clad laminate. In more detail, the present invention relates to a copper-clad laminate used for manufacturing a flexible printed wiring board (FPC) and the like.

BACKGROUND ART

A flexible printed wiring board obtained by forming a wiring pattern on a surface of a resin film is used for an electronic device such as a liquid crystal panel, a laptop computer, a digital camera and a mobile phone. The flexible printed wiring board is manufactured from a copper-clad laminate obtained by laminating a copper foil on the resin film.

The amount of information to be processed by the electronic device increases year by year. Accordingly, for some flexible printed wiring boards mounted on electronic devices, processing of high-frequency signals may be required. An insulating resin used for the resin film of the flexible printed wiring board includes a thermosetting resin and a thermoplastic resin. Between these resins, the thermoplastic resin may impart properties such as a low dielectric constant and a small dielectric loss, depending on its kind. A film made of this kind of thermoplastic resin is suitable for a flexible printed wiring board for high-frequency application.

Patent Document 1 discloses a plated laminate obtained by laminating an underlying layer and a copper layer on a liquid crystal polymer film that is a thermoplastic resin film. The underlying layer is a layer made of nickel, chromium, an alloy containing nickel or an alloy containing chromium, and is film-formed by a sputtering method to a thickness of 2 to 30 nm. By providing the underlying layer, it is possible to enhance adhesion between a resin film and a conductor layer.

CITATION LIST

Patent Document

Patent Document 1: Japanese Laid-open Patent Publication No. 2014-233891

SUMMARY OF INVENTION

Technical Problem

However, a thermoplastic resin film does not have high heat resistance comparable to a thermosetting resin film, and therefore, the temperature of the film during film-forming of an underlying layer may be increased, and then wrinkles may occur due to the deformation of the film. Accordingly, productivity may be decreased.

In view of the circumstances described above, an object of the present invention is to provide a copper-clad laminate that maintains adhesion between a resin film and a conductor layer, and that suppresses the occurrence of wrinkles.

Solution to Problem

A copper-clad laminate of a first aspect of the present invention has: a base film containing a thermoplastic resin; an underlying metal layer film-formed on a surface of the base film by a dry plating method; and a copper layer film-formed on a surface of the underlying metal layer; wherein the underlying metal layer has a mean thickness of 0.3 to 1.9 nm.

In the copper-clad laminate of a second aspect of the present invention, the underlying metal layer has a mean thickness of 0.3 to 1.5 nm, in the first aspect of the present invention.

In the copper-clad laminate of a third aspect of the present invention, the underlying metal layer is formed of an alloy containing at least two types of elements selected from the group consisting of nickel, chromium, vanadium, titanium, molybdenum and copper, in the first or the second aspect of the present invention.

In the copper-clad laminate of a fourth aspect of the present invention, the base film is a film of which a whole body or a surface layer is made of a liquid crystal polymer, a polyether ether ketone, a polyethylene naphthalate, a fluororesin, a thermoplastic polyimide or a cycloolefin polymer, in any one of the first to the third aspects of the present invention.

A method for manufacturing a copper-clad laminate of a fifth aspect of the present invention includes: film-forming an underlying metal layer on a surface of a base film containing a thermoplastic resin by a dry plating method; and film-forming a copper layer on a surface of the underlying metal layer; wherein the underlying metal layer has a mean thickness of 0.3 to 1.9 nm.

In the method for manufacturing the copper-clad laminate of a sixth aspect of the present invention, the underlying metal layer has a mean thickness of 0.3 to 1.5 nm, in the fifth aspect of the present invention.

In the method for manufacturing the copper-clad laminate of a seventh aspect of the present invention, the underlying metal layer is formed of an alloy containing at least two types of elements selected from the group consisting of nickel, chromium, vanadium, titanium, molybdenum and copper, in the fifth or the sixth aspect of the present invention.

In the method for manufacturing the copper-clad laminate of an eighth aspect of the present invention, the base film is a film of which a whole body or a surface layer is made of a liquid crystal polymer, a polyether ether ketone, a polyethylene naphthalate, a fluororesin, a thermoplastic polyimide or a cycloolefin polymer, in any one of the fifth to the seventh aspects of the present invention.

Advantageous Effects of Invention

According to the present invention, since the underlying metal layer has a mean thickness of 0.3 nm or more, it is possible to maintain adhesion between the base film and the conductor layer. In addition, since the underlying metal layer has a mean thickness of 1.9 nm or less, it is possible to suppress an increase in the temperature of the film during film-forming of the underlying metal layer, and it is possible to suppress the occurrence of wrinkles.

BRIEF DESCRIPTION OF DRAWING

FIG. 1 is a sectional view of a copper-clad laminate according to one embodiment of the present invention.

DESCRIPTION OF EMBODIMENTS

Next, embodiments of the present invention will be described with reference to the drawing.

As illustrated in FIG. 1, a copper-clad laminate 1 according to one embodiment of the present invention has a base film 10 and a conductor layer 20 film-formed on a surface of the base film 10. The conductor layer 20 has an underlying metal layer 21 and a copper layer 22. The underlying metal layer 21 and the copper layer 22 are laminated on a surface of the base film 10 in this order. As illustrated in FIG. 1, the conductor layer 20 may be film-formed on only one side of the base film 10 or the conductor layers 20 may be film-formed on both sides of the base film 10.

The base film 10 contains a thermoplastic resin. As the thermoplastic resin, that having properties of a low dielectric constant and a small dielectric loss is preferable. In this case, a flexible printed wiring board manufactured by using the copper-clad laminate 1 is suitable for high-frequency application.

The thermoplastic resin is not particularly limited, but the examples thereof include a liquid crystal polymer (LCP), a polyether ether ketone (PEEK), a polyethylene naphthalate (PEN), a fluororesin (PTFE, PFA, FEP, ETFE, PCTFE), a thermoplastic polyimide (PI) and a cycloolefin polymer (COP). Accordingly, as the base film 10, a film of which the whole body is made of the thermoplastic resin may be used. Further, as the base film 10, a film of which the core material is made of a thermosetting resin such as a thermosetting polyimide and of which the surface layer is made of the thermoplastic resin may be used.

The thermoplastic resin may contain other components, within a range not impairing physical properties as the base film 10 and the copper-clad laminate 1. For example, the thermoplastic resin may contain a polymer such as a polyether sulfone, a polyether imide, a polyamide, a polycarbonate and a polyphenylene ether, and an additive such as an antioxidant and an antistatic agent. In addition, the thermoplastic resin may contain an inorganic material such as silica and clay, and a filler such as a fiber for the purpose of improving a handling property as a film and the like.

The thickness of the base film 10 is not particularly limited, but the thickness is preferably 10 μm or more. When the thickness of the base film 10 is 10 μm or more, wrinkles are hard to occur during film-formation of the underlying metal layer 21.

It is preferable to perform dehydration treatment on the base film 10, Water contained in the resin is removed by dehydration treatment. Accordingly, it is possible to suppress lowering of adhesion between the base film 10 and the underlying metal layer 21 due to water contained in the resin.

It is preferable to perform surface modification treatment on the surface of the base film 10 in contact with the underlying metal layer 21. Surface modification treatment is performed, for example, by plasma treatment, ion beam irradiation or ultraviolet light irradiation. By surface modification treatment, the surface of the resin becomes a clean state, and further, a fragile layer is removed. Furthermore, by introducing polar groups into the surface of the resin, it is possible to enhance adhesion of the boundary surface to the underlying metal layer 21.

The underlying metal layer 21 is film-formed on a surface of the base film 10 by a dry plating method. The dry plating method is not particularly limited, but the examples thereof include a vacuum evaporation method, a sputtering method and an ion plating method. Among them, the sputtering method is preferable.

For example, by using a roll-to-roll type sputtering device, the underlying metal layer 21 may be film-formed on a surface of the base film 10. In more detail, a long strip-like base film 10 is mounted between an unwinding roll and a winding roll within the sputtering device. After evacuating the interior of the sputtering device, argon gas is introduced to maintain about 0.13 to 1.3 Pa. In this state, while conveying the base film 10 at a speed of about 1 to 20 m/min, electric power is supplied to the cathode to conduct sputtering electric discharge, and then the underlying metal layer 21 is film-formed on a surface of the base film 10 continuously.

The underlying metal layer 21 may be formed of an alloy containing at least two types of elements selected from the group consisting of nickel, chromium, vanadium, titanium, molybdenum and copper. The underlying metal layer 21 may contain 1 wt % or less of inevitable impurities contained in a sputtering target. Normally, the sputtering target and the film-formed thin metallic film have approximately the same composition. When a sputtering target having a desired composition as the underlying metal layer 21 is used, the underlying metal layer 21 having approximately the same composition may be film-formed.

It is preferable that the underlying metal layer 21 has a mean thickness of 0.3 to 1.9 nm. When the underlying metal layer 21 is film-formed by a sputtering method, and the film-formed thin metallic film have approximately the same composition. When a sputtering target having a desired composition as the underlying metal layer 21 is used, the underlying metal layer 21 having approximately the same composition may be film-formed.

It is preferable that the underlying metal layer 21 has a mean thickness of 0.3 to 1.9 nm. When the underlying metal layer 21 is film-formed by a sputtering method, the mean thickness of the underlying metal layer 21 may be adjusted by the conveyance speed of the base film 10 and the sputtering conditions.

When the mean thickness of the underlying metal layer 21 is 0.3 nm or more, adhesion between the base film 10 and the conductor layer 20 may be maintained. On the other hand, when the mean thickness of the underlying metal layer 21 is less than 0.3 nm, infiltration of an etching solution during wiring processing tends to make wiring parts float, and then peel strength of the wiring part tends to be decreased.

In addition, when the underlying metal layer 21 has a mean thickness of 1.9 nm or less, an increase in the temperature of the film during film-forming of the underlying metal layer 21 may be suppressed. Accordingly, it is possible to suppress the occurrence of wrinkles by using the base film 10 containing the thermoplastic resin that does not have high heat resistance comparable to a thermosetting resin.

In order to suppress the occurrence of wrinkles on the base film 10, the underlying metal layer 21 is preferred to be thinner. Accordingly, the underlying metal layer 21 has preferably a mean thickness of 1.5 nm or less, more preferably a mean thickness of 1.0 nm or less and especially preferably a mean thickness of 0.5 nm or less.

Furthermore, when a pulse current that flows through the wire is in a high-frequency range, more current flows on the surface of the wire due to the skin effect. Since the underlying metal layer 21 has lower electric conductivity than the copper layer 22, as the underlying metal layer 21 is thicker, the transmission loss becomes larger. In other words, as the underlying metal layer 21 is thinner, the transmission loss may become smaller. It is thought that when the underlying metal layer 21 has a mean thickness of 1.9 nm or less, transmission loss may be sufficiently reduced.

The copper layer 22 is film-formed on a surface of the underlying metal layer 21. Generally, but not being particularly limited, the thickness of the copper layer 22 is 10 nm to 18 μm. The copper layer 22 may be film-formed by a dry plating method, may be film-formed by a wet plating method, or may be film-formed by a combination of a dry plating method with a wet plating method.

When a relatively thin copper layer 22 having a thickness of 50 nm or less is film-formed, the copper layer 22 may be film-formed by a dry plating method only. Examples of the dry plating method include a vacuum evaporation method, a sputtering method and an ion plating method. For example, by providing a target for the underlying metal layer 21 and a copper target within a sputtering device, the underlying metal layer 21 and the copper layer 22 may be continuously film-formed.

When a relatively thick copper layer 22 is film-formed, a copper thin film layer may be film-formed by a dry plating method, and thereafter, a copper plating film may be laminated on the copper thin film layer by a wet plating method. Accordingly, the copper layer 22 having a desired thickness may be economically formed. In the case of film-forming of the copper plating film by a wet plating method, only electroplating may be performed. Alternatively, in such a case, the primary plating may be performed by an electroless plating method, and thereafter, the secondary plating may be performed by electroplating.

EXAMPLES

Next, Examples will be described.
(Common Conditions)
—Dehydration Treatment—

A long strip-like base film was installed in a vacuum device having a roll-to-roll mechanism. The base film was dehydrated by heating with an infrared heater while being conveyed in a state where the pressure in the device was made to 1 Pa or less by using a vacuum pump.
—Surface Modification Treatment—

After the pressure in the vacuum device was made to $1\times10^{-4}$ Pa or less, oxygen gas was introduced such that the pressure was 2.5 Pa. In this state, the surface of the base film was irradiated with a direct current discharge plasma for several seconds.
—Sputtering—

After the pressure in a sputtering device was made to $1\times10^{-4}$ Pa or less, argon gas was introduced such that the pressure was 0.3 Pa. In this state, an underlying metal layer and a copper thin film layer were film-formed on one side of the base film. Here, the thickness of the copper thin film layer was made to 100 nm.
—Electroplating—

Electroplating was performed by using a copper sulfate solution as a plating solution at a current density of 2 A/dm² such that a copper plating film with a thickness of 12 μm was film-formed on the surface of the copper thin film layer. Thereby, a copper-clad laminate was obtained.
—Characterization—

As measurement of initial adhesion between the base film and the conductor layer, peel strength was measured by a method in accordance with IPC-TM-650, NUMBER 2.4.9. Here, a dry film was laminated on a part of the copper-clad laminate to form a photosensitive resist film, and thereafter, exposure and development were performed, and the conductor layer was removed by etching with a ferric chloride solution. Thereafter, the resist was removed to form a lead wire with a width of 1 mm for evaluation of the peel strength. In addition, the peeling angle was made to 90°.

Example 1

A liquid crystal polymer film (manufactured by KURARAY CO., UFD., VECSTAR CTZ, the same is applied hereinafter) with a thickness of 50 μm was used as a base film. An underlying metal layer was film-formed by sputtering using a 20 mass % Cr—Ni alloy target. At this time, the mean thickness of the underlying metal layer was made to 0.3 nm. The peel strength of the obtained copper-clad laminate was 344 N/m. In addition, no wrinkles were observed on the base film after sputtering.

Example 2

A polyether ether ketone film (manufactured by KURABO INDUSTRIES LTD., EXPEEK) with a thickness of 50 μm was used as a base film. An underlying metal layer was film-formed by sputtering using a 20 mass % Cr—Ni alloy target. At this time, the mean thickness of the underlying metal layer was made to 0.3 nm. The peel strength of the obtained copper-clad laminate was 328 N/m. In addition, no wrinkles were observed on the base film after sputtering.

Example 3

A polyethylene naphthalate film (manufactured by Teijin Film Solutions Limited, Teonex Q83) with a thickness of 50 μm was used as a base film. An underlying metal layer was film-formed by sputtering using a 20 mass % Cr—Ni alloy target. At this time, the mean thickness of the underlying metal layer was made to 0.3 nm. The peel strength of the obtained copper-clad laminate was 323 N/m. In addition, no wrinkles were observed on the base film after sputtering.

Example 41

A fluororesin film (manufactured by AGC Inc., Fluon+ EA-2000) with a thickness of 50 μm was used as a base film. An underlying metal layer was film-formed by sputtering using a 20 mass % Cr—Ni alloy target. At this time, the mean thickness of the underlying metal layer was made to 0.3 nm. The peel strength of the obtained copper-clad laminate was 309 N/m. In addition, no wrinkles were observed on the base film after sputtering.

Example 5

A thermoplastic polyimide film (manufactured by KANEKA CORPORATION, Pixeo SR) with a thickness of 50 μm was used as a base film. An underlying metal layer was film-formed by sputtering using a 20 mass % Cr—Ni alloy target. At this time, the mean thickness of the underlying metal layer was made to 0.3 nm. The peel strength of the obtained copper-clad laminate was 349 N/m. In addition, no wrinkles were observed on the base film after sputtering.

Example 6

A liquid crystal polymer film with a thickness of 50 μm was used as a base film. An underlying metal layer was film-formed by sputtering using a 7 mass % Cr—Ni alloy target. At this time, the mean thickness of the underlying metal layer was made to 0.5 nm. The peel strength of the obtained copper-clad laminate was 356 N/m. In addition, no wrinkles were observed on the base film after sputtering.

Example 7

A liquid crystal polymer film with a thickness of 50 μm was used as a base film. An underlying metal layer was film-formed by sputtering using a 35 mass % Cu—Ni alloy target. At this time, the mean thickness of the underlying metal layer was made to 1.5 nm. The peel strength of the obtained copper-clad laminate was 382 N/m. In addition, no wrinkles were observed on the base film after sputtering.

Example 8

A liquid crystal polymer film with a thickness of 50 μm was used as a base film. An underlying metal layer was film-formed by sputtering using a 7 mass % V—Ni alloy target. At this time, the mean thickness of the underlying metal layer was made to 0.8 nm. The peel strength of the obtained copper-clad laminate was 365 N/m. In addition, no wrinkles were observed on the base film after sputtering.

Example 9

A liquid crystal polymer film with a thickness of 50 μm was used as a base film. An underlying metal layer was film-formed by sputtering using a 28 mass % Mo—Ni alloy target. At this time, the mean thickness of the underlying metal layer was made to 1.0 nm. The peel strength of the obtained copper-clad laminate was 391 N/m. In addition, no wrinkles were observed on the base film after sputtering.

Example 10

A liquid crystal polymer film with a thickness of 50 μm was used as a base film. An underlying metal layer was film-formed by sputtering using a 7.5 mass % Ti—Ni alloy target. At this time, the mean thickness of the underlying metal layer was made to 0.9 nm. The peel strength of the obtained copper-clad laminate was 370 N/m. In addition, no wrinkles were observed on the base film after sputtering.

Example 11

A liquid crystal polymer film with a thickness of 50 μm was used as a base film. An underlying metal layer was film-formed by sputtering using a 10 mass % Ni—Cu alloy target. At this time, the mean thickness of the underlying metal layer was made to 1.9 nm. The peel strength of the obtained copper-clad laminate was 317 N/m. In addition, no wrinkles were observed on the base film after sputtering.

Comparative Example 1

A liquid crystal polymer film with a thickness of 50 μm was used as a base film. An underlying metal layer was film-formed by sputtering using a 20 mass % Cr—Ni alloy target. At this time, the mean thickness of the underlying metal layer was made to 0.2 nm. The peel strength of the obtained copper-clad laminate was 291 N/m. In addition, no wrinkles were observed on the base film after sputtering.

Comparative Example 2

A liquid crystal polymer film with a thickness of 50 μm was used as a base film. An underlying metal layer was film-formed by sputtering using a 20 mass % Cr—Ni alloy target. At this time, the mean thickness of the underlying metal layer was made to 2.0 nm. The peel strength of the obtained copper-clad laminate was 400 N/m. In addition, some wrinkles were observed on the base film after sputtering.

The above-described Examples 1 to 11 and Comparative Examples 1 and 2 are summarized in Table 1.

TABLE 1

| | Film | Mean thickness of underlying metal layer [nm] | Peel strength [N/m] | Wrinkles after sputtering |
|---|---|---|---|---|
| Example 1 | LCP | 0.3 | 344 | None |
| Example 2 | PEEK | 0.3 | 328 | None |
| Example 3 | PEN | 0.3 | 323 | None |
| Example 4 | ETFE | 0.3 | 309 | None |
| Example 5 | PI | 0.3 | 349 | None |
| Example 6 | LCP | 0.5 | 356 | None |
| Example 7 | LCP | 1.5 | 382 | None |
| Example 8 | LCP | 0.8 | 365 | None |
| Example 9 | LCP | 1.0 | 391 | None |
| Example 10 | LCP | 0.9 | 370 | None |
| Example 11 | LCP | 1.9 | 317 | None |
| Comparative Example 1 | LCP | 0.2 | 291 | None |
| Comparative Example 2 | LCP | 2.0 | 400 | Sonic |

With regard to each of Examples 1 to 11, in which the underlying metal layer had a mean thickness of 0.3 nm or more, the peel strength was 300 N/m or more, and the initial adhesion between the base film and the conductor layer was sufficient. On the other hand, with regard to Comparative Example 1, in which the underlying metal layer had a mean thickness of 0.2 nm, the peel strength was 291 N/m and was weak. From the above, it is confirmed that when a mean thickness of an underlying metal layer is made to 0.3 nm or more, it is possible to maintain the initial adhesion between a base film and a conductor layer.

Further, with regard to Comparative Example 2, in which the underlying metal layer had a mean thickness of 2.0 nm, wrinkles were observed on the base film after sputtering. From the above, it is confirmed that when a mean thickness of an underlying metal layer is made to 1.9 nm or less, it is possible to suppress the occurrence of wrinkles.

REFERENCE SIGNS LIST

1 Copper-clad laminate
10 Base film
20 Conductor layer
21 Underlying metal layer
Copper layer

What is claimed is:
1. A copper-clad laminate comprising:
   a base film of which the whole body is made of a thermoplastic resin, wherein the base film has a thickness of 50 μm, and wherein the base film is subjected to surface modification treatment so that the surface of the resin base film becomes a clean state and further a fragile layer is removed;
   an underlying metal layer film-formed on a surface of the base film by sputtering; and
   a copper thin film layer film-formed on a surface of the underlying metal layer by sputtering,
   wherein the underlying metal layer has a mean thickness of 0.3 to 1.9 nm.

2. The copper-clad laminate according to claim 1, wherein the underlying metal layer has a mean thickness of 0.3 to 1.5 nm.

3. The copper-clad laminate according to claim 1, wherein the underlying metal layer is formed of an alloy containing at least two types of elements selected from the group consisting of nickel, chromium, vanadium, titanium, molybdenum and copper.

4. The copper-clad laminate according to claim 1, wherein the base film is a film of which the whole body is made of a liquid crystal polymer, a polyether ether ketone, a polyethylene naphthalate, a fluororesin, a thermoplastic polyimide or a cycloolefin polymer.

5. The copper-clad laminate according to claim 1, wherein the underlying metal layer has a mean thickness of 0.3 to 0.9 nm.

6. The copper-clad laminate according to claim 1, further comprising a copper plating film film-formed on a surface of the copper thin film layer.

* * * * *